(12) United States Patent
Schulz et al.

(10) Patent No.: US 6,436,305 B1
(45) Date of Patent: Aug. 20, 2002

(54) PASSIVATING ETCHANTS FOR METALLIC PARTICLES

(75) Inventors: Douglas L. Schulz, Medford, MA (US); Calvin J. Curtis, Lakewood; David S. Ginley, Evergreen, both of CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/674,061

(22) PCT Filed: Jan. 21, 2000

(86) PCT No.: PCT/US00/01742
§ 371 (c)(1),
(2), (4) Date: Mar. 12, 2001

(87) PCT Pub. No.: WO00/43573
PCT Pub. Date: Jul. 27, 2000

Related U.S. Application Data
(60) Provisional application No. 60/116,561, filed on Jan. 21, 1999.

(51) Int. Cl.$^7$ .................................................. C23F 1/00
(52) U.S. Cl. ...................... 216/100; 216/101; 216/102
(58) Field of Search .................................. 216/100, 101, 216/102

(56) References Cited

U.S. PATENT DOCUMENTS

| | | | | |
|---|---|---|---|---|
| 4,410,569 A | * | 10/1983 | Siedle | 427/304 |
| 5,098,516 A | * | 3/1992 | Norman et al. | 156/666 |
| 5,273,775 A | * | 12/1993 | Dyer et al. | 427/99 |
| 5,387,315 A | * | 2/1995 | Sandhu | 156/646 |
| 5,980,983 A | * | 11/1999 | Gordon | 427/226 |

OTHER PUBLICATIONS

Goldstrin, A.N. et al., "Melting in Semiconductor Nanocrystals," Science, (192), vol. 256, pp. 1425–1427.
Combes, C.J., "The melting of smallparticles of lead and indium," J. Phys. F: Metal Phys., vol. 2 (1972), pp. 441–449, printed in Great Britain.
Wronski, C.R.M., "The size dependence of the melting point of small particles of tin," Brit. J. Appl. Phys., (1967), vol. 18, pp. 1731–1737.
Goldstein, A.N., "The Thermodynamic Properties of Semiconductor Nanocrystals," dissertation, University of California at Berkeley (1993).

* cited by examiner

*Primary Examiner*—Anita Alanko
(74) *Attorney, Agent, or Firm*—Paul J. White

(57) ABSTRACT

The present invention provides a process for etching a corrosion layer, such as oxide or hydroxide, from and concomitantly forming a passivating layer on the surface of metallic nanoparticles. A reaction mixture is prepared by dispersing sodium hexafluoroacetylacetonate (Na(hfa)) and a metallic particle powder having oxide or hydroxide corrosion layers in hexane solvent. The mixture is allowed to react for a time sufficient to etch the oxide or hydroxide groups from the particulate surface and passivate the surfaces with (hfa). Hexane may be evaporated from the mixture and any excess Na(hfa) separated from the reaction mixture by sublimation or rinsing with a polar aprotic solvent. In an embodiment of the present invention, aluminum particles are first etched and passivated and then used to form ohmic contacts with p-type silicon. This etching/passivation improves the electrical properties of the contact.

8 Claims, 1 Drawing Sheet

PASSIVATING ETCHANTS FOR METALLIC PARTICLES

This appln is a 371 of PCT/US00/01742 filed Jan. 21, 2000 which claims benefit of Prov. No. 60/116,561 filed Jan. 21, 1999.

TECHNICAL FIELD

This invention relates to thin film silicon solar cells and methods for forming particle-derived ohmic contacts with p-type silicon. A process is provided for etching the oxide or hydroxide corrosion layer from the surface of metallic particles, such as aluminum, which is shown to improve the electrical properties of the contacts to the p-type silicon.

BACKGROUND ART

While various methods for the production of particle derived thin-films have been reported, the thin-film application of these materials in microelectronics has been hampered by a lack of good interparticle connectivity when applied as films to substrates. This connectivity, both structural and electrical, is in many cases limited by the formation of a corrosion layer (i.e., oxide or hydroxide) contaminating the surface of the particles. These passivated surfaces generally give rise to an insulating effect electrically and an impedance in particle sintering structurally.

In order to form a thin-film for use in photoconversion and microelectronic device applications, the regions coated with particles are typically sintered to ensure electrical continuity across the feature. A reduced melting temperature for nanophase metals (C. R. M. Wronski, *Brit. J. Appl. Phys.,* (1967)18:1731; J. F. Pocza, A. Barna and P. B. Barna, *J. Phys. F.* (1972)2:441) and semiconductors (A. N. Goldstein, C. M. Echer and A. P. Alivisatos, *Science,* (1992)256:1425; and A. N. Goldstein, Ph. D. dissertation, University of California at Berkley (1993)) has previously been shown. These disclosures are incorporated by reference herein. High temperature sintering often eliminates some of the problems associated with surface contamination. However, in the formation of nanoparticle contacts with photovoltaic semiconductors, standard high-temperature sintering often cannot be performed due to thermal limitations which are associated with the underlying layers of the device.

In view of the foregoing considerations, there is an apparent need for a low temperature method for etching the corrosion oxide or hydroxide layers. Etching improves the electrical conductivity across the feature and is useful in the formation of particle-derived ohmic contacts, such as aluminum, with a p-type silicon layer of silicon solar cells. The formation of a post-etch passivation layer impedes further corrosion and renders the particles stable to oxidizing and hydrous environments. Accordingly, a primary object of the present invention is to provide a method for etching a metallic particle surface to remove the corrosion layer to form a post-etch passivating layer on the particles, and, ultimately, to improve electrical conductivity of metal contacts.

Another object of the present invention is to provide an improved method for forming ohmic contacts derived from metallic particles, such as aluminum, with a p-type silicon layer of a silicon solar cell.

These and other objects of the present invention will become apparent throughout the description of the invention which now follows.

DISCLOSURE OF INVENTION

The present invention provides a process for etching a corrosion layer, such as oxide or hydroxide, from and concomitantly forming a passivating layer on the surface of metallic nanoparticles. A reaction mixture is prepared by dispersing, sodium hexafluoroacetylacetonate (Na(hfa)) and a metallic particle powder having oxide or hydroxide corrosion layers in hexane solvent. The mixture is allowed to react for a time sufficient to etch the oxide or hydroxide groups from the particulate surface and passivate the surfaces with (hfa). Hexane maybe evaporated from the mixture and any excess Na(hfa) separated from the reaction mixture by sublimation or rinsing with a polar aprotic solvent. In an embodiment of the present invention, aluminum particles are first etched and passivated and then used to form ohmic contacts with p-type silicon. This etching/passivation improves the electrical properties of the contact.

DESCRIPTION OF THE PREFERRED EMBODIMENTS

Figure 1:
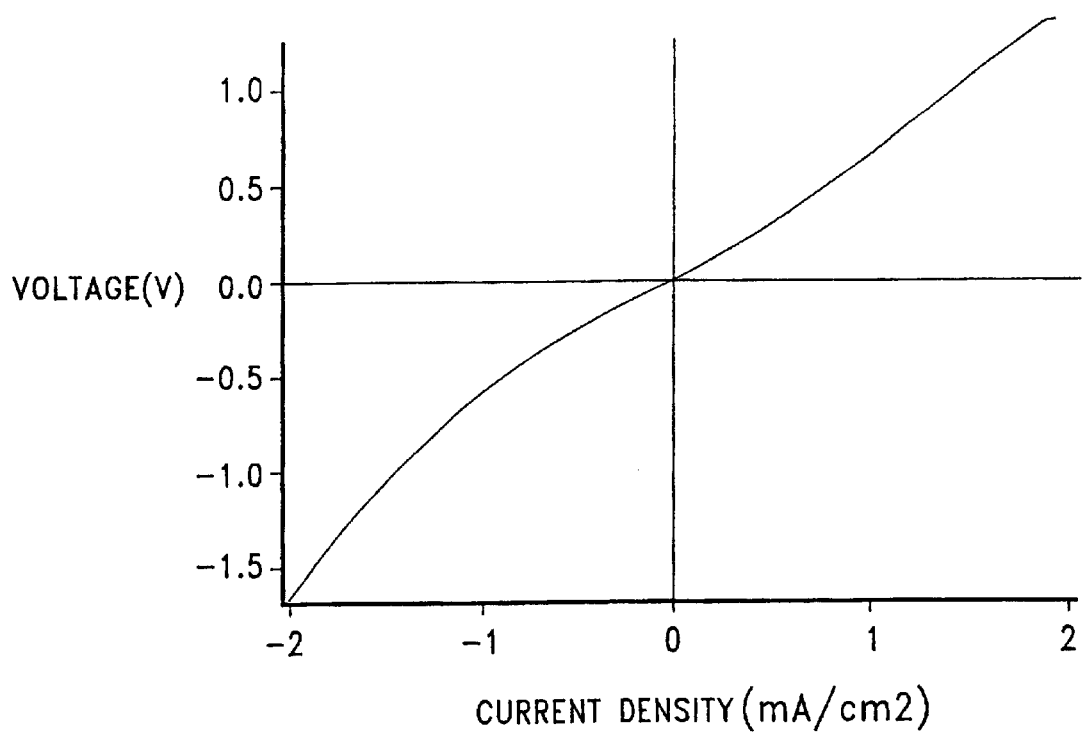
FIG. 1 shows the current-voltage characteristics of a solar cell where particulate aluminum is slurried onto p-type Si and annealed at 645° in argon for one hour. This is the control sample.
Figure 2:
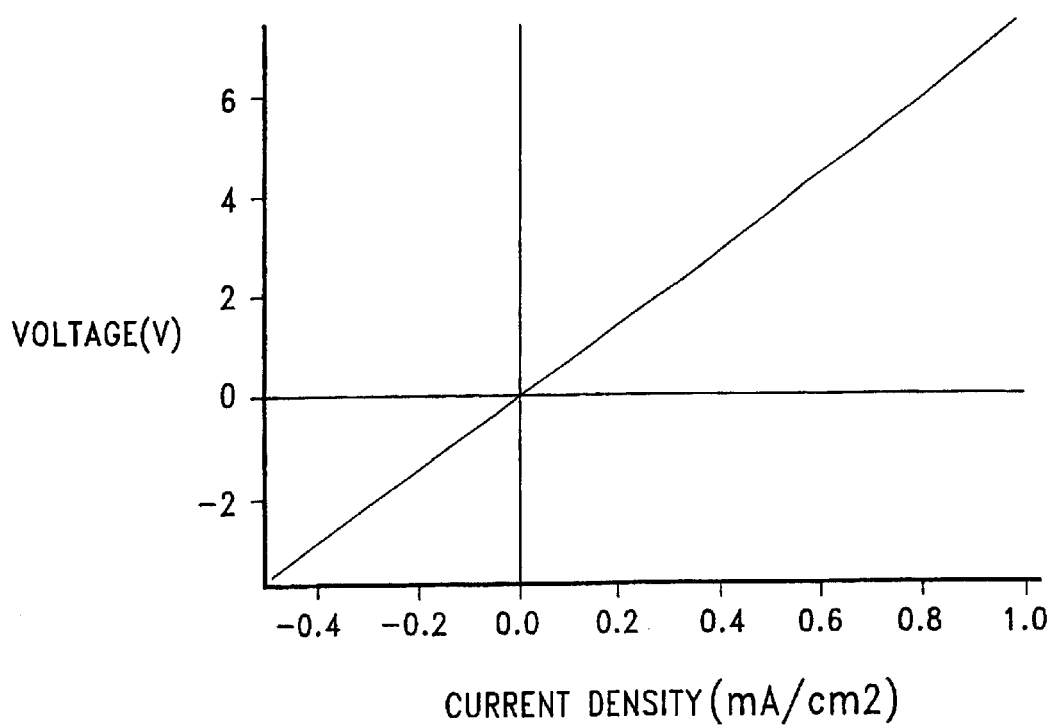
FIG. 2 shows the current-voltage characteristics of a solar cell where particulate aluminum is etched/passivated with Na(hfa), according the method of the present invention, slurried onto p-type Si, and annealed at 649° in argon for one hour.

While it is within the scope of the present invention to use particles of a greater size, in the preferred embodiment nanoparticles are used. A nanoparticle is a particle having dimensions in the nanometer range, that is, of less that 10 nm. While materials in this size range may be utilized, the preferred size range is from 3–8 nm. The nanoparticles include, without limitation, all metals and alloys having useful properties as contacts to semiconductors, such as Ni, Au, Al, Ag, and Au-Ga. The particle derived ohmic contacts, according to the invention herein, can be formed on any suitable surface or substrate, for example on carbon, silicon, germanium, III-V semiconductors, II–VI semiconductors, and I–III–VI$_2$ semiconductors. These compounds, and their application in solid state electronic devices, are well known. All references herein to a Class of compounds herein refers to the Class of Elements as set forth in the Periodic Table of the Elements, published by the American Chemical Society. The disclosure of all patents cited herein are incorporated by reference.

The present invention provides for etching a corrosion layer, such as oxide or hydroxide, from and concomitantly forming a passivating layer on the surface of metallic particles. Ohmic contacts formed by slurry deposition of a Na(hfa) etched/passivated particulate aluminum powder, and annealed with p-type Si provides one example of an ohmic contact having desirable current-voltage characteristics. The example which follows describes in detail the process for preparing Na(hfa)-etched/passivated aluminum particles.

EXAMPLE

A particle aluminum reaction mixture was prepared by dispersing 0.12 g Al particulate powder into a mixture comprising 11.0 hexafluoroacetylacetonate in approximately 150 ml hexane. An aliquot of NaH was added to the reaction mixture and the mixture was allowed to react approximately twelve hours with stirring under nitrogen gas aeration. These mixing conditions provided a sufficient time for etching of the oxide and/or hydroxide groups from the Al particles an concomitant formation of a passivation layer. Hexane supernatant was then decanted from the reaction mixture and the remaining suspension was separated by centrifugation at 2,600 rpm for 10 minutes. Supernatant fluid was then decanted from the centrifuge tube and the remaining solvent removed in vacuo. The remaining solid was transferred to a Dailey Sublimer in a He-filled globe box. The sublimer was placed onto a Schlenk line and evacuated to $10^{-3}$ torr. An oil bath was employed and the mixture was heated to 200° C. At this temperature, the unreacted Na(hfa) sublimed up to the cold finger leaving Na(hfa)-treated Al particles in the bottom. FTIR spectroscopy of a sample of Na(hfa)-treated Al showed peaks due to the hfa ligand. TEM-EDS showed a marked reduction in oxygen content as well as the appearance of fluorine.

Na(hfa)-treated Al powder was then applied to p-type Si to check for ohmic contact. A control sample was prepared using untreated Al powder on p-type Si. In both instances, an aliquot of Al was slurried with hexane in a He-filled glovebox and dropped onto the Si wafer. These samples were transferred to a tube furnace, the tube was purged with argon, and the samples were heated for one hour at 645–649° C. After the contact anneal, the residue that remained where the Al slurry was dropped, was removed using an isopropanol-wetted Q-tip. Silver paint was added to these regions and I–V characterization was performed.

What is claimed is:

1. A process for etching the corrosion layer from and concomitantly passivating the surface of metallic particles, comprising:
   a) forming a reaction mixture by dispersing particles, having a passivating surface layer, in a solution comprising sodium hexafluoroacetylacetonate (Na(hfa)) and hexane; and
   b) reacting the mixture for a time sufficient to etch and passivate the surface.

2. The process of claim 1 wherein species comprising the passivating surface layer are selected from a group consisting of oxide and hydroxide.

3. The process of claim 2 wherein the metallic particles are aluminum.

4. The process of claim 1 further comprising evaporating hexane from the reaction mixture after reacting the mixture and then removing unreacted Na(hfa) by sublimation.

5. The process of claim 4 wherein sublimation is about 200° C. and $10^{-3}$ torr.

6. The process of claim 1 wherein the particles comprise nanoparticles in the range of 1–10 nm.

7. The process of claim 6 wherein the nanoparticles are in the range of 3–8 nm.

8. The process of claim 1 further comprising evaporating hexane from the reaction mixture after reacting the mixture and then removing unreacted Na(hfa) by rinsing with polar aprotic solvent.

* * * * *